United States Patent
Sartschev

(12) 
(10) Patent No.: US 6,291,981 B1
(45) Date of Patent: Sep. 18, 2001

(54) AUTOMATIC TEST EQUIPMENT WITH NARROW OUTPUT PULSES

(75) Inventor: Ronald A. Sartschev, Dunstable, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/625,827

(22) Filed: Jul. 26, 2000

(51) Int. Cl.⁷ .................................................. G01R 25/00
(52) U.S. Cl. ............................ 324/76.82; 324/76.47; 327/217; 327/199
(58) Field of Search ................................. 327/217, 199, 327/200, 173, 174, 176; 324/76.82, 73.1, 76.47, 76.77

(56) References Cited

U.S. PATENT DOCUMENTS 3,686,565 * 8/1972 Kelem et al. ...................... 324/76.47
3,947,697 * 3/1976 Archer et al. ......................... 327/154
4,119,910 * 10/1978 Hayashi ............................. 324/76.77

OTHER PUBLICATIONS

"Synthesis Technique for CMOS Folded Source–Coupled Logic Circuits" Sailesh Maskai, et al. IEEE Journal of Solid State Circuits Aug. 1992, pp. 1157–1167.

* cited by examiner

*Primary Examiner*—Safet Metjahic
*Assistant Examiner*—Vincent Q. Nguyen
(74) *Attorney, Agent, or Firm*—Edmund J. Walsh

(57) ABSTRACT

Automatic test equipment suitable for testing high speed semiconductor devices. The test equipment includes a formatter circuit with a flip flop that produces an output in the desired format even if the edge signals that control the setting and resetting of the flip flop overlap. The flip flop allows the test system to generate outputs with narrow pulses, and can generate output pulses that are narrower than the controlling edge signals.

7 Claims, 5 Drawing Sheets

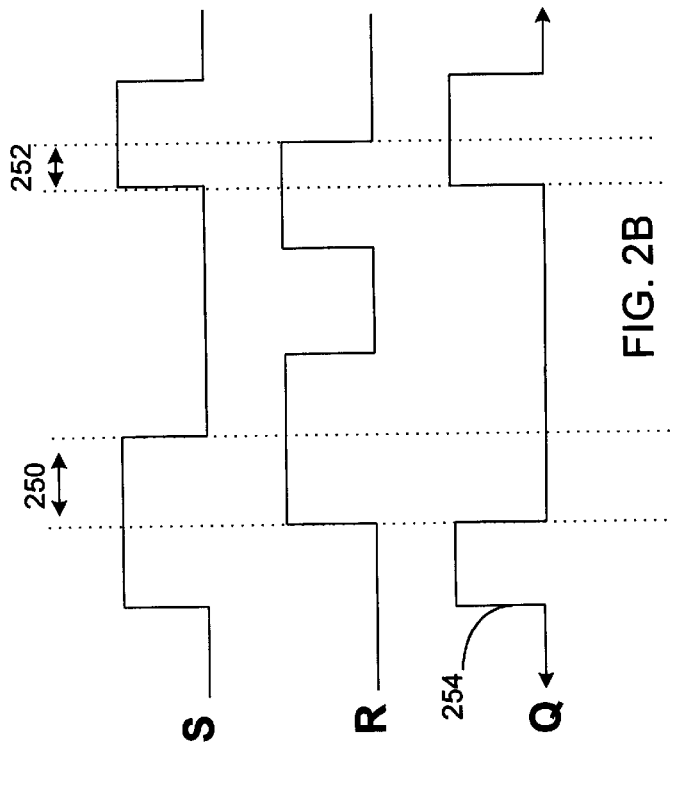
FIG. 2B
FIG. 2C
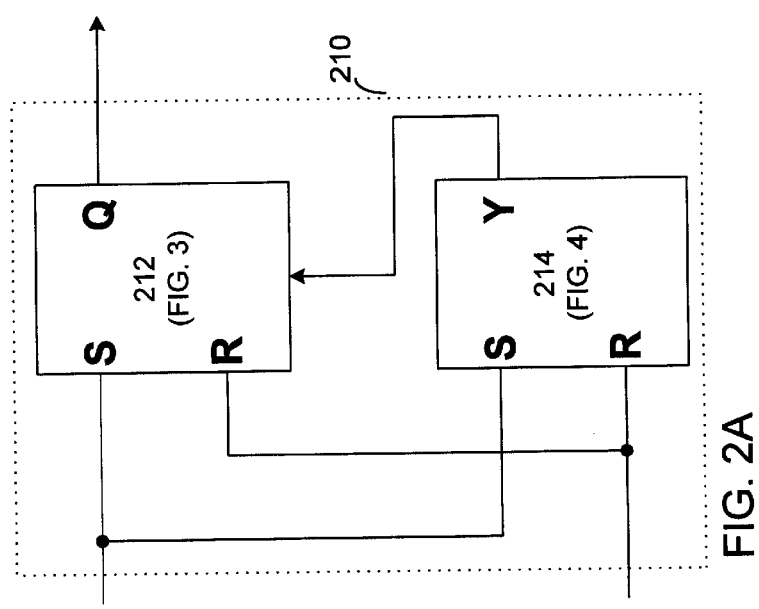
FIG. 2A

| S | R | Y | Q |
|---|---|---|---|
| 0 | 0 | 0 | $Q_{n-1}$ |
| 0 | 0 | 1 | $Q_{n-1}$ |
| 0 | 1 | 0 | 0 |
| 0 | 1 | 1 | 0 |
| 1 | 0 | 0 | 1 |
| 1 | 0 | 1 | 1 |
| 1 | 1 | 0 | 1 |
| 1 | 1 | 1 | 0 |

FIG. 3B

| S | R | Y |
|---|---|---|
| 0 | 0 | $Y_{n-1}$ |
| 0 | 1 | 0 |
| 1 | 0 | 1 |
| 1 | 1 | $Y_{n-1}$ |

FIG. 4B

AUTOMATIC TEST EQUIPMENT WITH NARROW OUTPUT PULSES

This invention relates generally to automatic test equipment and more specifically to the circuitry that allows automatic test equipment to generate stimulus signals with narrow pulse widths.

Automatic test equipment is widely used to test semiconductor components during their manufacture. The automatic test equipment generates stimulus signals and measures responses from a device under test. The responses are compared to the expected responses from a fully functioning chip to determine whether the device under test is fully functional.

The automatic test equipment is programmed with a pattern that represents the stimulus and expected data for a device under test. Different kinds of devices under test will require different patterns for testing. Thus, the automatic test equipment must be flexible enough to generate a wide range of signals that are compatible with the types of signals many types of chips generate or receive.

FIG. 1 shows a prior art test system in simplified block diagram form. The system includes a tester body 110 and a computer work station 112 that controls the operation of the tester body and provides a user interface.

Within tester body 110, there are multiple copies of circuitry called a channel 114. Each channel 114, generates or measures a signal on one lead of a device under test. A channel 114 includes a pattern generator 120, a timing generator 122 a failure processor 124, a formatter 126 a driver 128 and a comparator 130.

Pattern generator 120 stores the pattern that defines the data that is to be applied or is expected during each cycle of tester operation. The data specifies whether the tester is to drive data or measure data during that cycle. The pattern includes information specifying the data value, such as a logic 1 or a logic 0.

Additionally, the format of the signal must be specified. For example, some semiconductor devices represent a logical 1 by having a signal line at a high voltage during an entire cycle. Other chips represent a logical 1 by changing the voltage on a signal line during a cycle. Still others represent a logical 1 by a voltage pulse on a line during the cycle. Further, where a voltage transition during the cycle is used to represent a signal, the time at which that transition occurs might be different for different chips under test.

Modern testers are sufficiently flexible that they can be programmed for almost any signal format. To achieve this flexibility, the tester includes a timing generator 122. The timing generator generates what are known as "edge" signals. These are signals that change state at a time that can be programmed into the timing generator.

The edge signals are combined by a formatter 126 to produce an output signal of the desired shape. For example, to create a pulse that starts 0.5 nsec after the start of a cycle and has a width of 1 nsec, one of the edge signals would be programmed to occur 0.500 nsec after the start of the cycle. Another edge signal would be programmed to occur at 1.5 nsec after the start of the cycle. The formatter would combine these signals to create the desired signal to be applied to driver 128. Driver 128 produces the signal that is applied to the device under test.

More specifically, formatter 126 uses the first edge to define when driver 128 is turned on and the second edge to define when driver 128 is turned off. Traditionally, the circuit that combines the edges is a S-R flip-flop. A S-R flip-flop has an Set input and a Reset input. While a logic high signal is applied to the Set input, the output of the flip-flop is high. While a logic high is applied to the Reset input, the output of the flip-flop is low. While both the Set and Reset inputs are low, the S-R flip-flop holds its state.

In a tester, the data in the pattern generator 120 controls which edges are applied to the flip flop in each cycle. For example, in a cycle in which the channel 114 should output a signal that is goes high at 0.5 nscec and low at 1.5 nsec, the tester will gate an edge to the S input of the flip flop that goes high at 0.5 nsec. Separately, an edge that goes high at 1.5 nsec is gated to the R input of the flip flop.

Because there are multiple edge signals which can all be programmed to occur at different times, the tester can be programmed to generate nearly any type of waveform. A limitation arises, though, when a very fast signal is to be generated.

An S-R flip-flop does not work in a tester when the signals at the S and R inputs are both high. Setting both the S and R inputs of a flip-flop high represents an invalid input condition. The flip-flop can not be simultaneously set and reset. In some flip-flop designs, setting both the S and R inputs high at the same time produces a random output. Other S-R flip-flop designs place the output of the flip-flop in a known state—either high or low—when both inputs are asserted.

In testers, this problem has been conventionally dealt with in two ways. First, the duration of the edge signals is made very short relative to the length of a tester period. In this way, the chance that edge signals will drive the S and R inputs of the flip-flop simultaneously will be reduced. However, this approach is not well suited for generating signals to test very fast chips. As the period gets smaller, the width of the edge signal would have to be very small for the edge signal to be only a small fraction of the period. It is difficult to make an accurate timing generator that operates at high data rates when the width of the edge signal must be very small.

The second way that the problem has been dealt with is by providing a timing specification. The specification provides a minimum time that must be programmed between an edge that will be applied to the Set input of the flip-flop and the Reset input of the flip-flop to ensure that both edges are not high at the same time. However, this specification limits the width of the output pulses that can be generated by driver 128. It would be desirable to allow driver 128 to generate very narrow pulses, particularly for testing high speed devices.

SUMMARY OF THE INVENTION

With the foregoing background in mind, it is an object of the invention to provide a test system that can generate narrow output pulses.

The foregoing and other objects are achieved in a test system that employs a formatter with an improved flip-flop. The flip-flop provides the desired outputs even when its Set and Reset inputs overlap.

BRIEF DESCRIPTION OF THE DRAWINGS

The invention will be better understood by reference to the following more detailed description and accompanying drawings in which

FIG. 2A is a high level block diagram of a modified flip-flop circuit according to the invention;

FIG. 2B is a timing diagram illustrating the operation of the circuit of FIG. 2A;

FIG. 2C is a truth table illustrating the operation of the circuit of FIG. 2A;

FIG. 3B is a truth table illustrating the operation of the circuit in FIG. 3A;

FIG. 4B is a truth table illustrating the operation of the circuit in FIG. 4A.

DESCRIPTION OF THE PREFERRED EMBODIMENT

Figure 1:
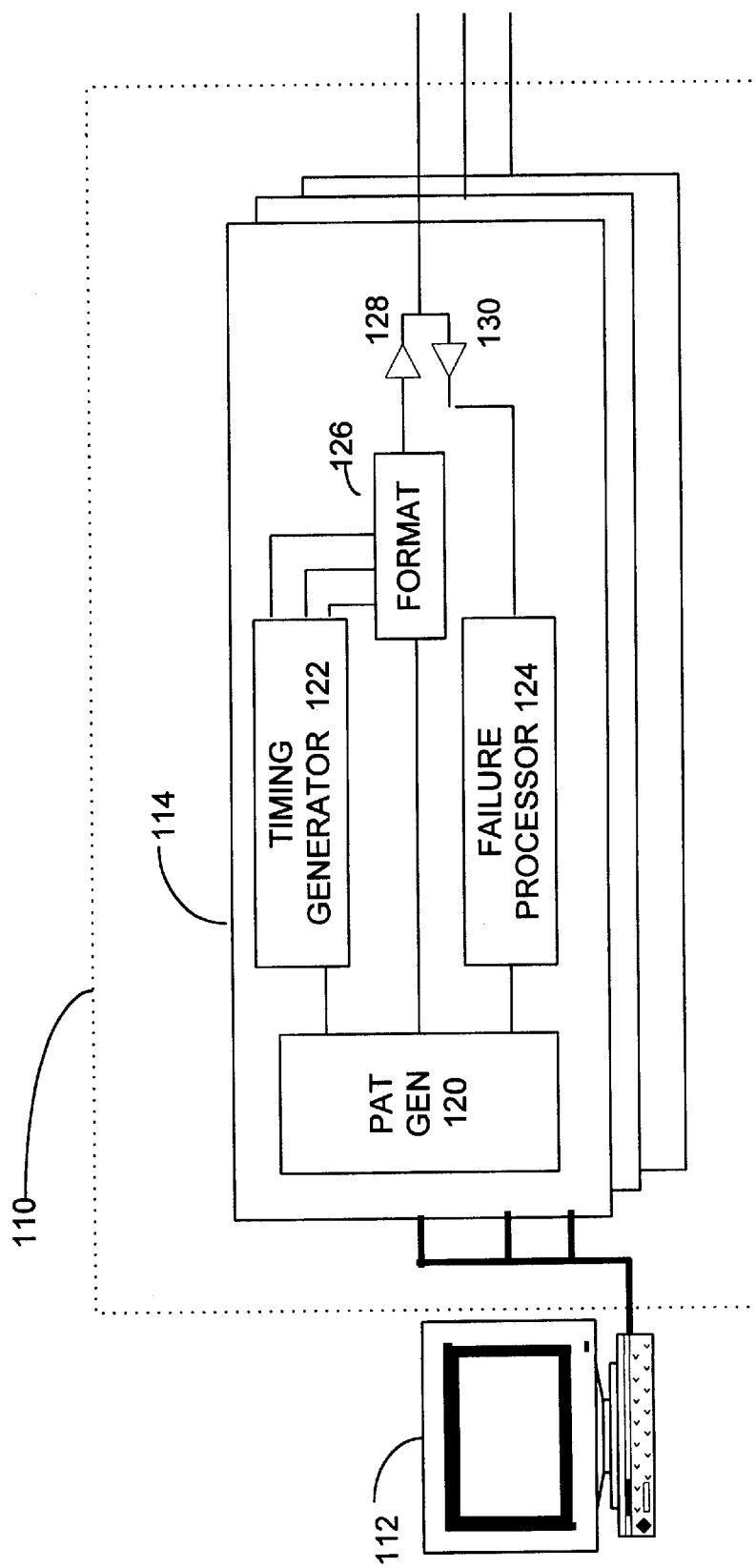
FIG. 1 is a simplified block diagram of a prior art test system.

FIG. 1 shows a simplified block diagram of a test system. The test system of the invention will include an improved flip-flop in formatter 126. FIG. 2A shows a high level block diagram of the improved flip-flop 210.

Flip-flop 210 is drawn with two stages, stages 212 and 214. Each of the stages 212 and 214 is connected to the S and the R inputs of flip-flop 210. The output of stage 212 is designated as Q, the output of flip-flop 210. Stage 214 produces an output Y, which is connected as an input to stage 212.

In the preferred embodiment, flip-flop 210 is implemented using differential logic. Thus, each input and output is actually a pair of signal traces. However, for simplicity, only a single line is drawn. Also, in the preferred embodiment, flip-flop 210 is implemented using CMOS circuit construction techniques and is likely a part of an ASIC chip that includes all of formatter 126. However, the precise construction technique is not important to the invention. For example, many automatic test systems use ECL circuit construction techniques and the circuits disclosed herein could be implemented in ECL, as well.

FIG. 2B illustrates the intended operation of flip-flop 210 when the Set and Reset edges are both asserted simultaneously. FIG. 2B shows two regions 250 and 252 in which the Set and Reset signals overlap. Overlap occurs in region 250 because the Reset signal is asserted before the Set signal pulse is over. Overlap occurs in region 252 because the Reset signal is still asserted when the Set signal goes high.

When used in a test system, the signals that are coupled to the S and R inputs of flip-flop 210 are "edge" signals. To produce the intended output at driver 128, flip-flop 210 should produce an output that is based on the timing of the first edge in each of the S and R signals. Thus, in region 250, the S signal is initially asserted, but the output Q returns to a logic 0 when the R signal is asserted. Even though both S and R are asserted, the output is a logical 0 in region 250. In contrast, in region 252, the R signal is initially asserted but the output Q is a logical 1 when the S signal is asserted. Even though both the S and R signals are asserted, the output is a logical 1 in region 252.

Thus, different outputs of flip-flop 210 are required at different times when both the S and R signals are asserted. The overall operation of flip-flop 210 is illustrated by the truth table in FIG. 2C.

FIG. 2C shows that flip-flop 210 operates as a conventional flip-flop when one, but not both of the S or R signals is asserted. Specifically, if the S signal is asserted, the output is a logical 1. If the R signal is asserted, the output is a logical 0.

Flip-flop 210 also operates as a conventional flip-flop when neither S nor R signal is asserted. FIG. 2C indicates that the value of Q is the same as $Q_{n-n}$, meaning that the value of Q does not change from its prior value.

However, when both S and R are a logical 1, the Q output is indicated to be a "*". This value symbolizes that the value at the output depends on the order in which the S and R signals are asserted. In particular, flip-flop 210 is designed, when both S and R are logical high, to take a state based on which input changed second.

The benefit of using such a flip-flop in automatic test equipment can be seen in FIG. 2B. A narrow output pulse 254 can be produced. In particular, output pulse 254 is narrower than the width of the edge signals that are driving the S and R inputs of formatter 126.

Figure 3A:
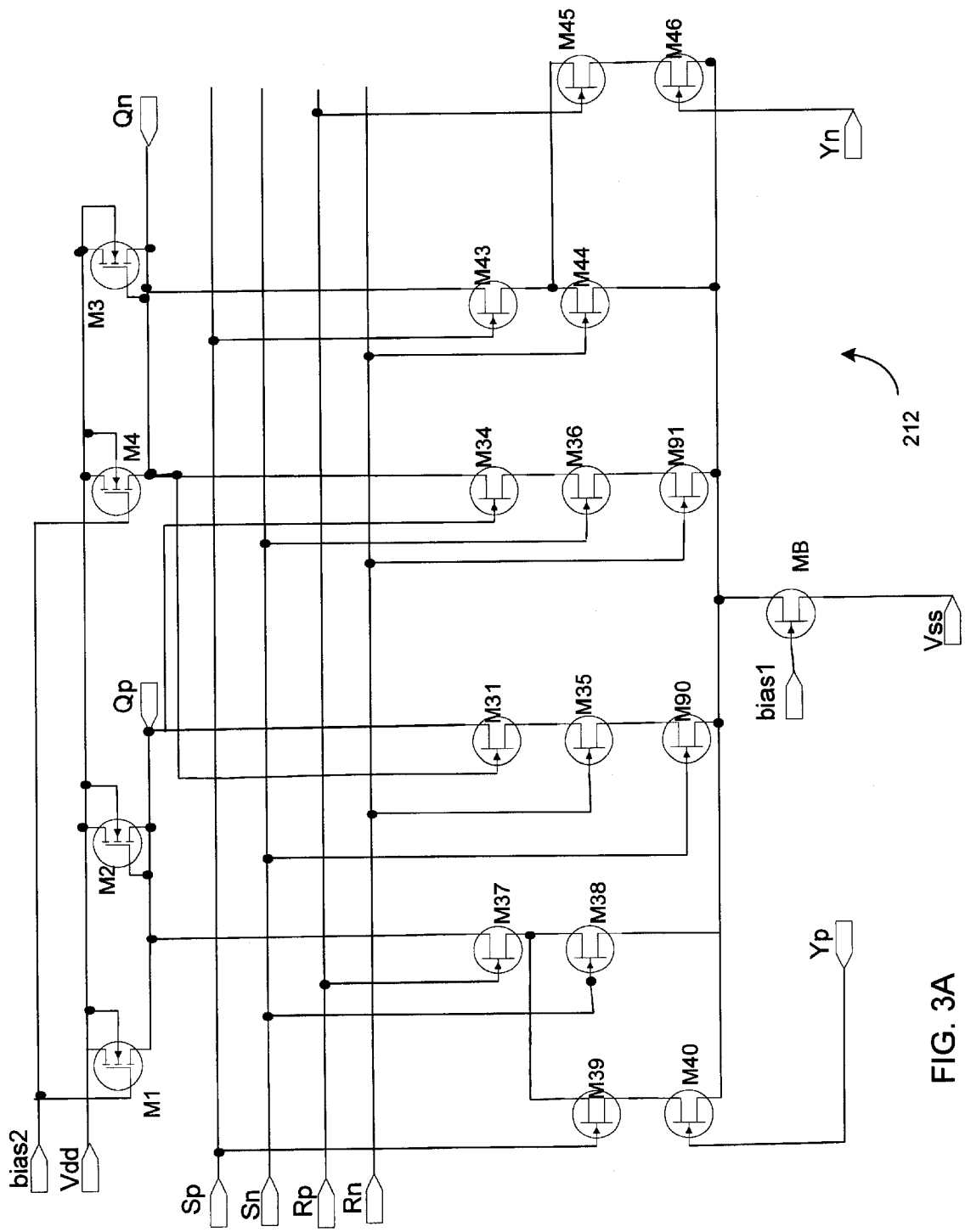
FIG. 3A is a more detailed circuit diagram of a portion of the circuit of FIG. 2A.
Figure 4A:
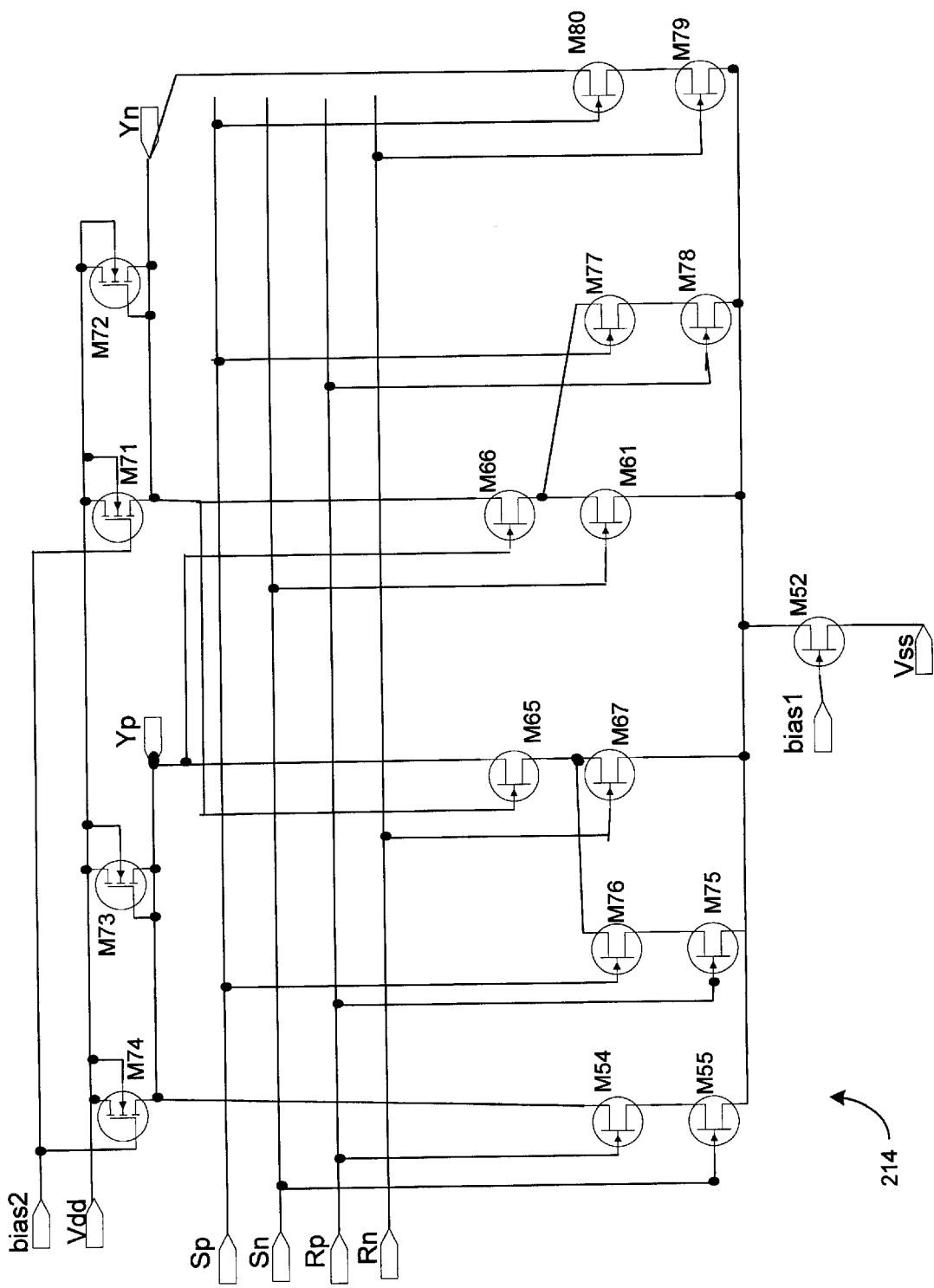
FIG. 4A is a more detailed circuit diagram of a portion of the circuit of FIG. 2A.

FIG. 3A and 4A give an example of the circuitry that could be used to implement stages 212 and 214. In the illustrated example, differential circuits are used. Thus, each signal has two lines, which are denoted p and n. Thus, the signal S is made up of lines Sp and Sn. The signal R is made up of Rp and Rn. Likewise, signals Q and Y also have p and n components.

Turning first to FIG. 4A, an implementation of stage 214 is shown. In addition to the S and R inputs and the Y output, stage 214 is shown to include power connections Vdd and Vss, which are conventional in a CMOS integrated circuit. Two bias signals, bias1 and bias2 are shown.

Bias1 is applied to transistor M52 to establish a current flow of I through that transistor. Bias2 is applied to transistors M71 and M74 such that the combined current flow each of these transistors equals 1/2. Each of the transistors M71, M72, M73 and M74 is designed to pass the same amount of current, so that transistors M73 and M74 combine to a pass a current equal to I if Yp is high and M71 and M72 combine to pass a current I if Yn is high.

A logical high output is represented by having output Yp at a high voltage, near Vdd, and Yn at a low voltage, close to Vss. When all the paths from Yp through to transistor M52 are non-conducting, output Yp will be pulled up towards Vdd through transistors M73 and M74. However, if any of the paths from the point Yp through to transistor M52 is conducting, the point Yp will be pulled down to the level of Vss through transistor M52.

There are three possible paths from Yp through to transistor M52. One path is created if both transistors M54 and M55 are conducting. A second path is created if all three of transistors M65, M75 and M76 are conducting. A third path is created if both transistors M65 and M67 are conducting.

The gate inputs of transistors M54 and M55 are connected to Rp and Sn, respectively. This path will therefore be conducting if Sn is high and Rp is low. This conditions occurs if the S input is logic 0 and the R input logic 1. Turning to FIG. 4B, the truth table for the circuit in FIG. 4A is shown. The truth table indicates that when the S input is 0 and the R input is 1, the Y output should be 0.

Because Yp is pulled down towards Vss when S is 0 and R is 1, the required condition is established. It should be noted that the right half of the circuit performs the complementary function on Yn so that the outputs Yp and Yn produce a differential signal.

More specifically, Yn is pulled up towards Vdd through transistors M71 and M72 when all of the paths through to transistor M52 are non-conducting. Yn is pulled down to Vss through transistor M52 when any of the paths are conducting. Those paths are formed through transistors M79 and M80, or through transistors M66, M77 and M78 or through transistors M61 and M66.

In the case where Sn and Rp are both at 1, Sp and Rn will both be at 0. Thus, transistors M79 will be off. In the path through transistors M66, M77 and M78, transistor M77 will be off making the path non-conducting. In the path through transistors M61 and M66, the gate of M66 is connected to the drain of M54 through the point Yp. Because Yp is being pulled toward Vss through M54 and M55, the gate of M66 will be pulled down and transistor M66 will be off. Thus, none of the paths will pull Yn towards Vss and Yn will be pulled up to Vdd. Thus, when S has a 0 value and R has a 1 value, the output of the circuit will be a 0, represented by Yp having a low value and Yn having a high value. In this way, the second line of the truth table is implemented.

When S is 1 and R is 0, the path through transistors M79 and M80 will be conducting and the other paths will be non-conducting. Thus, Yn will be pulled towards Vss and Yp will be pulled up towards Vdd. This condition reflects the third line of the truth table in FIG. 4B.

When both S and R are 0, transistors M54, M75, M76, M77, M78 and M80 will be off. Transistors M61 and M67 will be conducting. Thus, a conducting path connecting Yp to Vss will be created if M65 is turned on. Conversely, a conducting path will be created connecting Yn to ground if M66 is turned on. M65 is turned on if Yn is 1 and M66 is turned on if Yp is a 1.

If Yp is at a high state and Yn is at a low state, Yn will be connected to Vss and Yp will be pulled up to Vdd. This represents a stable state, meaning that Yp will stay high and Yn will stay low. If, on the other hand, Yp is at a low state and Yn is at a high state, M65 will be turned on and M66 will be turned off, causing Yp to stay low and Yn to stay high. Thus, when the S and R inputs are both zero, Y will keep whatever value it has. This condition is reflected in the first line of the truth table in FIG. 4B by indicating that the value of Y is Yn−1.

A similar condition occurs if both S and R inputs are 1. Transistors M54, M67, M61 and M79 are off. Transistors M75 and M76 are both on and a conducting path between Y and Vss is created if M65 is turned on. Transistors M77 and M78 are both turned on and a conducting path is created between Yn and Vss if M66 is turned on.

As above, whether M65 or M66 is turned on depends the state Y was in when the inputs to the circuit of FIG. 4I both became 1. Y will retain its value when the values of S and R become 1. This condition is reflected in the fourth line of the truth table in FIG. 4B.

The circuit in FIG. 3A operates on similarly principles to implement the truth table of FIG. 31B. M1 and M2 will pull output Qp high unless there is a conducing path that pulls it towards Vss. Those paths are through transistors M37, M39 and M49 or through transistors M37 and M38 or through M31, M35 and M90. Conversely, Qn will be pulled high through M3 and M4 unless it is pulled down through one of the paths to Vss. Those paths are through transistors M34, M36 and M91 or through transistors M43 and M44 or through transistors M43 M45 and M46.

When S and R are both 0, transistors M35, M90, M36 and M91 are on. Either M31 or M34 will be turned on, depending on the state of the Q outputs. Thus, Qp and Qn will retain their state, as indicated by the first two lines of the truth table in FIG. 33B. These lines implement the first line in the truth table of FIG. 2C.

If S is 0 and R is 1, transistors M37 and M38 will conduct, pulling Qp to Vss. None of the paths connecting Qn to Vss will conduct and Qn will be pulled up to Vdd. This state reflects the third and fourth lines of the truth table. These lines implement the second line in the truth table of FIG. 2C.

When S is 1 and R is 0, transistors M43 and M44 will conduct, pulling Qn towards Vss. None of the paths connected to Qp will conduct, meaning that Q will have a 1 value, as represented by the fourth and fifth lines of the truth table of FIG. 3B. These two lines implement the third line of the truth table in FIG. 2C.

When S and R are both 1, M37 and M39 will both be on. Likewise, M43 and M45 will both be on. M38, M35, M90, M36, M91 and M44 will be off. Thus, either a path through M37, M39 and M40 will conduct to pull Qp towards Vss or a path through M43, M45 and M46 will conduct to pull Qn towards Vss. Which one of these paths conducts depends on the value of Y.

If Y is 1. Qp will be pulled to Vss. Conversely, if Y is 0, Qn will be pulled to Vss. As indicated in the last two lines of the truth table in FIG. 3B, if the S and R inputs are both 1, the output will be the opposite of Y.

The last two lines of the truth table in FIG. 3B implement the fourth line of the truth table if FIG. 2C. From FIG. 4B, when S and R are both 1, the Y output will have the value of Yn−1. More specifically, if the previous state was that S was 1 and R was 0, the prior Y output was 1 according to the third line of the truth table of FIG. 4B. Thus. Y retains the value of 1. According to the last line of the truth table of FIG. 3B, the Q output becomes 0. Thus, if S is 1 first and then R becomes 1, the output of flip flop 210 becomes 0.

Conversely, if the prior state was that R was 1 and S was 0, the prior Y output was 0, as indicated by the second line of the truth table in FIG. 4B. According to the fourth line in the truth table of FIG. 4B, the Y output retains a 0 value if S subsequently takes on a 1 value. This state is represented by the seventh line of the truth table in FIG. 3B. As indicated in this line, the Q output takes on a 1 state. Thus, if R is 1 first and S becomes 1, the output of flip flop 210 becomes 1.

Thus, the circuits in FIG. 3A and 31B is a suitable circuit for implementing flip flop 210 to have the switching characteristics illustrated in FIG. 2B and represented by the truth table in FIG. 2C.

Having described one embodiment, numerous alternative embodiments or variations might be made. For example, the circuit is shown to be implemented with CMOS technology. Other technologies might be employed.

Also, tile specific circuit design might be altered. For example, it should be noted that the Y input has no impact on the Q output unless both S and R are a logic 1. Some simplifications might be made without departing from the invention.

Further, it should be noted that stage 214 could be a traditional RS flip-flop. What has been described herein as a flip flop made up of stages 212 and 214 could also be described as a traditional flip flop with additional circuitry following it. But, partitioning the circuit in that fashion would not depart from the invention.

Further, automatic test equipment that can produce narrow output pulses could alternatively be achieved by processing the edge signals to make them very narrow before applying them to the R and S inputs of a flip flop. One circuit configuration that will achieve this result is an RS flip flop having each of the R and S inputs passing through a two-input NAND gate before application to the flip flop. Each of the NAND gates has a slight delay associated with one of its inputs. The output of the NAND gate is a narrow pulse that has a width equal to the length of the slight delay. Thus, only a small separation between the S and R edge signals is required to avoid improper operation of the test system.

As another example, it will be noted that the described circuit has different numbers of transistors connected to the positive and negative lines of the S and R signals. It might be desirable to include dummy transistors to equalize the loads on each half of a differential pair.

Further, it should be noted that the circuit was described with a Vdd correlating to a logic 1. The voltage levels used to represent a logic 1 or a logic 0 could be different. It is possible that a logic 0 might be represented by a voltage level that is higher than the voltage use to represent a logic 1. Circuits to produce the correct output for other voltage levels could be implemented.

Also, the circuit of the invention was described in conjunction with automatic test equipment. The circuit is particularly well suited for use in the formatter circuit of automatic test equipment because it allows very narrow output pulses to be generated while the test system is operating at a high data rate. In contrast to a prior art test systems in which the pulse width of an output pulse was constrained by the width of the edge pulses generated by a timing generator, a test system made with a circuit as described above is not so limited. It should be appreciated that, having learned of the teachings of the invention, one of skill in the art might create other formatter circuits in which the output depends on the order in which set and reset edges are asserted.

Therefore, the invention should be limited only by the spirit and scope of the appended claims.

What is claimed is:

1. A flip-flop circuit suitable for use in automatic test systems comprising:
   a) a set input;
   b) a reset input;
   c) a first stage having inputs coupled to the set and reset inputs and an intermediate output, the intermediate output indicating the order in which the set and reset inputs were asserted when the set and reset inputs are both asserted;
   d) a second stage having inputs coupled to the set and reset inputs and an input coupled to the intermediate output of the first stage and an output, the output having a value responsive to the intermediate output when the set and reset inputs are both asserted.

2. The circuit of claim 1 wherein the set input, the reset input, the intermediate output and the output of the second stage are represented as differential signals.

3. The circuit of claim 1 wherein the intermediate output signal is a logic HI when the set and reset inputs are both asserted and the set input was asserted before the reset input and is a logic LO when the set and reset inputs are both asserted and the set input was asserted after the reset input.

4. The circuit of claim 3 wherein the output of the second stage is a logic HI when the set and reset inputs are asserted and the intermediate output is logic LO, and is a logic LO when the set and reset inputs are asserted and the intermediate output is a logic HI.

5. The circuit of claim 1 wherein the first stage has on output point coupled to an upper power supply through at least one transistor that is biased in an on state, and is switchably coupled to a lower power supply through one of a plurality of paths including a plurality of transistors, with a portion of the plurality of transistors having control inputs coupled to the set and reset inputs and at least one of the transistors having a control input coupled to a signal with a value representative of the intermediate output.

6. The circuit of claim 5 wherein the path containing the transistor coupled to a signal with a value representative of the intermediate output is in a path containing transistors that have control inputs connected to the set and reset inputs such that said transistors are turned on when at least one of the transistors in all of the other paths is turned off.

7. The circuit of claim 5 wherein the set input and the reset input are represented as differential signals and there are two output points with one representing the positive leg of the intermediate output signal and one representing the negative leg of the intermediate output signal and there are a further plurality of paths whereby each of the output points is switchably coupled to the lower power supply through one of a plurality of paths.

* * * * *